(12) United States Patent
Nitta et al.

(10) Patent No.: US 6,281,526 B1
(45) Date of Patent: Aug. 28, 2001

(54) NITRIDE COMPOUND LIGHT EMITTING DEVICE AND METHOD FOR FABRICATING SAME

(75) Inventors: Koichi Nitta; Haruhiko Okazaki; Tokuhiko Matsunaga, all of Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/034,258

(22) Filed: Mar. 4, 1998

(30) Foreign Application Priority Data

Mar. 5, 1997 (JP) .................................................. 9-050111

(51) Int. Cl.[7] .............................. H01L 33/00; H01L 23/48
(52) U.S. Cl. ............................ 257/103; 257/99; 257/744; 257/745
(58) Field of Search ............................... 257/91, 99, 103, 257/102, 743, 744, 745

(56) References Cited

U.S. PATENT DOCUMENTS 5,929,466 * 7/1999 Ohba et al. ........................... 257/103
5,990,500 * 11/1999 Okazaki ................................ 257/99

FOREIGN PATENT DOCUMENTS 5-291621   5/1993   (JP) .

OTHER PUBLICATIONS

Hiroshi Amano et al., "P–Type Conduction in Mg–Doped GaN Treated with Low–Energy Electron Beam Irradiation (LEEBI)", Japanese Journal of Applied Physics, vol. 28, No. 12 Dec. 1989, pp. 2112–2114.

Shuji Nakamura et al., "P–Gan / N–InGaN / N–GaN Double Heterostructure Blue–Light–Emitting Diodes", Japanese Journal of Applied Physics, vol. 32, No. 1, Jan. 15, 1993, pp. 8–11.

English translation of Abstract for Japanese Patent Office Publication No. 5–291621, May 1993.

* cited by examiner

Primary Examiner—Minh Loan Tran
(74) Attorney, Agent, or Firm—Finnegan, Henderson, Farabow, Garrett & Dunner, L.L.P.

(57) ABSTRACT

An electrode of a metal, which is one of Group IV and VI elements, is deposited on an n-type $In_xAl_yGa_{1-x-y}N$ layer. Alternatively, after an electrode material of carbon, germanium), selenium, rhodium, tellurium, iridium, zirconium, hafnium, copper, titanium nitride, tungsten nitride, molybdenum or titanium silicide, is deposited on an n-type $In_xAl_yGa_{1-x-y}N$ layer or a p-type $In_xAl_yGa_{1-x-y}N$ layer, an impurity for increasing the carrier concentration of the semiconductor layer is ion-implanted, and the annealing is carried out. Thus, it is possible to provide a light emitting semiconductor device, which has a low contact resistance and a sufficient bond strength to the $In_xAl_yGa_{1-x-y}N$ layer while maintaining the crystallinity of the $In_xAl_yGa_{1-x-y}N$ layer.

15 Claims, 11 Drawing Sheets

NITRIDE COMPOUND LIGHT EMITTING DEVICE AND METHOD FOR FABRICATING SAME

BACKGROUND OF THE INVENTION

The present invention relates generally to a light emitting semiconductor device and a method for fabricating the same. More specifically, the invention relates to a light emitting compound semiconductor device, which has an electrode having good adhesion and a low contact resistance, and a method for fabricating the same.

Semiconductors with the composition $In_xAl_yGa_{1-x-y}N$ ($0 \leq x \leq 1$, $0 \leq y \leq 1$, $x+y \leq 1$), which are Group III–V nitride compound semiconductors, are direct gap semiconductors, and have a band gap varying in the range of from 1.89 to 6.2 eV by controlling x and y of the composition, so that these semiconductors are promising materials for LEDs (light emitting diodes) and semiconductor laser diodes. In particular, if the semiconductors can emit light at a high luminance in a wavelength region of blue, it is possible to or increase the storage capacity of various optical memory disks, and it is possible to realize a full color display. Therefore, blue light emitting semiconductor devices with the composition $In_xAl_yGa_{1-x-y}N$ have been rapidly developed to stabilize their characteristics and to improve their reliability. Throughout the specification, it is assumed that the compositions "$In_xAl_yGa_{1-x-y}N$" include all the compositions wherein the composition ratios x and y vary in the range of from 0 to 1. For example, it is assumed that the compositions "$In_xAl_yGa_{1-x-y}N$" also include GaN (x=0, y=0).

References disclosing the structures of conventional blue light emitting device of nitride semiconductors include: Jpn. J. Appl. Phys., 28(1989)p. L2112; Jpn. J. Appl. Phys., 32(1993)p. L8; and Japanese Patent Laid-Open No. 5-291621.

In light emitting devices, an electrode section for supplying driving current has a very important role for the characteristics of the light emitting devices. In nitride compound semiconductors, it is particularly important to select the structure and material of an electrode for the nitride compound semiconductors, since it is generally difficult to obtain a good ohmic contact.

For example, in the aforementioned Jpn. J. Appl. Phys., 28(1989)p. L2112, aluminum (Al) is used as an electrode material for an n-type $In_xAl_yGa_{1-x-y}N$ layer. In the aforementioned Jpn. J. Appl. Phys., 32(1993)p. L8, gold (Au) is used as the electrode material. In the aforementioned Japanese Patent Laid-Open No. 5-291621, any one of chromium (Cr), titanium (Ti) and indium (In) is used as the electrode material.

However, if aluminum, chromium, titanium or indium is used as the electrode material for the n-type $In_xAl_yGa_{1-x-y}N$ layer, there is a problem in that the contact resistance is relatively high in all cases. That is, if an electrode of aluminum is used to prepare a LED to evaluate its current/voltage characteristics, the differential resistance thereof is as high as hundreds $\Omega$ at a current of 20 mA. The current density of a semiconductor laser diode must be higher than that of a LED, so that it is required to further decrease the contact area of the electrode. Therefore, in the case of the semiconductor laser, the differential resistance in the current/voltage characteristics is further increased. As a result, there is a problem in that the operating voltage of the laser rises to increase its threshold current due to heat generation and to saturate an optical output power. This problem is not caused only in the case of the electrode of aluminum, but it is also caused in the case of an electrode of chromium, titanium or indium. There is also a problem in that the crystallinity of a semiconductor layer deteriorates if the carrier concentration in the semiconductor layer is increased to decrease the contact resistance. For example, in order to increase the carrier concentration in an n-type $In_xAl_yGa_{1-x-y}N$ layer, if impurities are doped higher than or equal to $1 \times 10^{19}$ cm$^{-3}$, the crystallinity of the layer deteriorates and the surface morphology thereof also deteriorates. In a typical blue nitride semiconductor device, an n-type semiconductor layer is used as an underlayer, and p-type semiconductor layers are sequentially epitaxial-grown thereon. Therefore, if the crystallinity of the n-type semiconductor layer serving as the underlayer deteriorates, the surface morphology thereof deteriorates, and the crystallinity of the semiconductor layers, such as an active layer, formed thereon also deteriorates, so that there is a serious problem in that it is not possible to obtain good emission characteristic.

On the other hand, there is a problem in that the above described conventional electrode structure has a relatively high contact resistance. In particular, it is not easy to provide a good ohmic contact for the p-type $In_xAl_yGa_{1-x-y}N$ layer,. Therefore, the same problems as the above problems are caused by the high contact resistance in a n-side electrode as well as in a p-side electrode.

Moreover, since the conventional electrode does not have a sufficient bond strength to the $In_xAl_yGa_{1-x-y}N$ layer, there are problems in that the device resistance is easy to increase and the electrode is easy to be peeled off. Therefore, there is a problem in that the initial characteristics of the light emitting device is not only deteriorated, but the reliability thereof is also deteriorated. Moreover, if the bond strength of the electrode is not sufficient, it is difficult to achieve a so-called flip-chip mounting. Therefore, there is a problem in that it is not possible to achieve the improvement of electrical and optical characteristics and the reduction of packaging dimension, which are able to obtained by the flip-chip mounting.

SUMMARY OF THE INVENTION

All the above described problems of the prior art are caused by the fact that the electrodes of the conventional light emitting nitride device can not meet the requirements for the improvement of the bond strength and the reduction of the contact resistance while maintaining the crystallinity of the semiconductor layers.

It is therefore an object of the present invention to eliminate the aforementioned problems and to provide a light emitting semiconductor device having an electrode structure, which has a low contact resistance and a sufficient bond strength to $In_xAl_yGa_{1-x-y}N$ layer while maintaining the crystallinity of the $In_xAl_yGa_{1-x-y}N$ layer, and a method for producing the same.

In order to accomplish the aforementioned and other objects, in the first preferred embodiment of the present invention, an electrode of a metal including a Group IV or VI element is deposited on an n-type $In_xAl_yGa_{1-x-y}N$ layer to reduce the contact resistance thereto and improve the bond strength of the electrode while maintaining the crystallinity of the semiconductor layer.

In the second preferred embodiment of the present invention, after an electrode material of carbon, germanium, selenium, rhodium, tellurium, iridium, zirconium, hafnium, copper, titanium nitride, tungsten nitride, molybdenum or titanium silicide is deposited on an n-type or p-type $In_xAl_yGa_{1-x-y}N$ layer, impurities for increasing the carrier concentration in the semiconductor layer thus obtained are ion-implanted and annealed. Thus, it is possible to reduce the contact resistance and improve the bond strength of the electrode while maintaining the crystallinity of the semiconductor layer.

That is, according to one aspect of the present invention, a first light emitting semiconductor device is characterized in that a first metal layer containing at least one element component of Group IV and VI elements is deposited on a contact region of a stacked structure of n-type $In_xAl_yGa_{1-x-y}N$ layer, which comprises a plurality of stacked semiconductor layers, and the element component of at least one of Group IV and VI elements contained in the first metal layer is diffused to penetrate into the semiconductor layers, so that the carrier density in the contact region increases and the contact resistance to the first metal layer decreases.

The first metal layer preferably contains, as a major component, at least one metallic element selected from the group consisting of gold, nickel, silver, titanium and aluminum.

The element component is preferably at least one element selected from the group consisting of carbon, silicon, oxygen, sulfur and selenium.

According to another aspect of the present invention, a second light emitting semiconductor device is characterized in that a first metal layer of at least one element selected from the group consisting of carbon, germanium, selenium, rhodium, tellurium, iridium, zirconium, hafnium, copper, titanium nitride, tungsten nitride, molybdenum and titanium silicide, is deposited on a contact region of a stacked structure of $In_xAl_yGa_{1-x-y}N$ layer comprising a plurality of stacked semiconductor layers.

The contact region is preferably formed so that the ion implantation of impurities is carried out via the first metal layer to increase the carrier concentration and decrease the contact resistance to the first metal layer.

The conductive type of the contact region is preferably n type, and the impurity is preferably a Group IV or IV element.

The impurity is preferably at lease one element selected from the group consisting of carbon (C), silicon (Si), tin (Sn), sulfur (S), selenium (Se) and tellurium (Te).

Alternatively, the conductive type of the contact region may be p type, and the impurity may be a Group II element.

The Group II element is preferably any one of beryllium (Be), magnesium (Mg), zinc (Zn), calcium (Ca), strontium (Sr), cadmium (Cd) and mercury (Hg).

According to a further aspect of the present invention, there is provided a method for fabricating the first light emitting semiconductor, which comprises the steps of: forming a stacked structure by stacking a plurality of compound semiconductor layers containing at least an n-type $In_xAl_yGa_{1-x-y}N$ ($0 \leq x \leq 1$, $0 \leq y \leq 1$, $x+y \leq 1$) layer; depositing a first metal layer containing at least one element component of Group IV and VI elements on at least a part of the n-type $In_xAl_yGa_{1-x-y}N$ layer; and raising temperature to diffuse the element component, which is contained in the first metal layer, in the n-type $In_xAl_yGa_{1-x-y}N$ layer to increase a surface carrier concentration to decrease a contact resistance to the first metal layer.

The first metal layer is preferably deposited by the sputtering method.

According to a still further object of the present invention, there is provided a method for fabricating the second light emitting semiconductor, which comprises: a step of forming a stacked structure by stacking a plurality of compound semiconductor layers containing at least an $In_xAl_yGa_{1-x-y}N$ ($0 \leq x \leq 1$, $0 \leq y \leq 1$, $x+y \leq 1$) layer; a deposition step of depositing a first metal layer on at least a part of the $In_xAl_yGa_{1-x-y}N$ layer; an ion implantation step of injecting an impurity into the $In_xAl_yGa_{1-x-y}N$ layer via the first metal layer; and a heat treatment step of raising temperature to activate the impurity injected into the contact region to increase a surface carrier concentration in the $In_xAl_yGa_{1-x-y}N$ layer to decrease a contact resistance to the first metal layer.

In the deposition step, the thickness of the first metal layer is preferably in the range of from 1 nm to 500 nm. In the ion implantation step, the acceleration voltage is preferably in the range of from 10 keV to 1000 keV, and the dose is preferably in the range of from $1 \times 10^{13}$ ion/cm$^2$ to $1 \times 10^{17}$ ion/cm$^2$. In the heat treatment step, the heat treatment temperature is preferably in the range of from 400° C. to 1200° C.

With this construction, the present invention has the following advantageous effects.

First, according to the present invention, it is possible to reduce the contact resistance of the electrode of the light emitting semiconductor device. Therefore, it is possible to decrease the operating voltage of the light emitting semiconductor device, and it is possible to improve the emission characteristics by decreasing the optical output power caused by heat generation and suppressing the threshold current rise.

According to the present invention, it is also possible to improve the bond strength of the electrode of the light emitting semiconductor device. Therefore, it is possible to inhibit the deterioration of the reliability, such as the increase of the device resistance and the contact failure due to the peeling of the electrode. In addition, it is possible to improve the physical durability to oscillation and so forth, so that the reliability of a digital versatile disc (DVD), an optical disk regeneration unit, an optical communication system, a display and so forth, on which the light emitting semiconductor device is mounted, can be considerably improved so as to be easily handled. As a result of the improvement of the bond strength of the electrode, it is possible to easily achieve the so-called flip chip packaging. Therefore, it is possible to simplify a packaging process to improve the electrical and optical performances of the light emitting semiconductor device in the packaging state, and it is possible to reduce the dimension thereof.

According to the present invention, since the calorific value of the light emitting semiconductor device decreases, it is possible to inhibit the diffusion and penetration of the impurity of the electrode material and so forth, which cause crystal defects in the semiconductor layer of the light emitting semiconductor device. Therefore, it is possible to prevent the deterioration of emission characteristics due to DLD and so forth caused by the crystal defects, so that it is possible to extend the life time of the emission characteristics of the light emitting semiconductor device to improve the reliability thereof.

It is also possible to improve a surge voltage resistance. Therefore, it is possible to improve the reliability of the light emitting semiconductor device, and it is not required to provide any protecting means and protecting circuits, which are conventionally required for surge.

In addition, it is possible to obtain various conspicuous advantages as described above, by using a conventional fabrication equipment as it is without the need of the preparation of special raw materials.

Thus, according to the present invention, it is possible to produce a light emitting semiconductor device having a high performance and high reliability in a high yield by using a simple process, so that the present invention has considerable industrial merits.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of a light emitting semiconductor device according to the present invention will be described below.

Figure 1A:
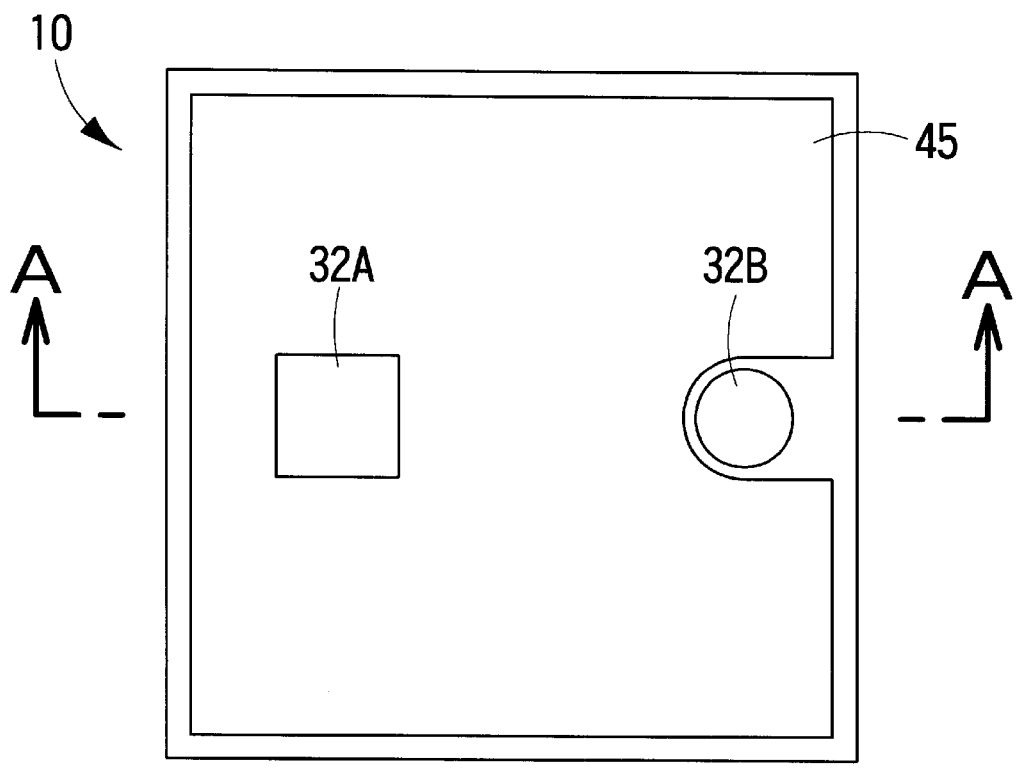
FIG. 1A is a schematic plan view of the first preferred embodiment of a light emitting semiconductor device according to the present invention.
Figure 1B:
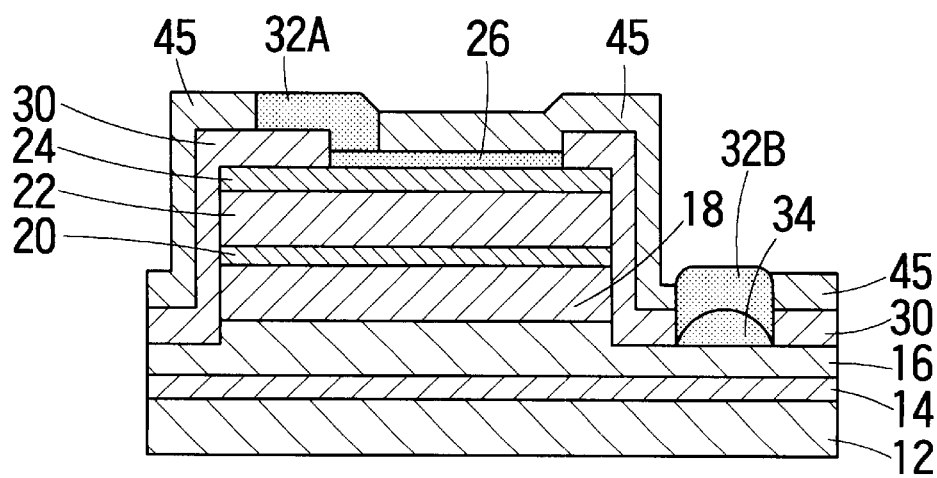
FIG. 1B is a schematic sectional view thereof.

FIG. 1A is a schematic plan view of the first preferred embodiment of a light emitting semiconductor device according to the present invention, and FIG. 1B is a schematic sectional view taken along line A—A of FIG. 1A. In these figures, a light emitting device 10 is a light emitting gallium nitride device for emitting a light having a waveband of ultraviolet to green.

First of all, the schematic construction of the light emitting device 10 will be described below.

The light emitting device 10 has a multilayered structure of semiconductor layers grown on a sapphire substrate 12. On the sapphire substrate 12, a buffer layer 14, an n-type contact layer 16, an n-type cladding layer 18, an active layer 20, a p-type cladding layer 22 and a p-type contact layer 24 are formed in this order.

The material of the buffer layer 14 may be an n-type or undoped $In_xAl_yGa_{1-x-y}N$. The n-type contact layer 16 is an n-type semiconductor layer having a high carrier concentration so as to ensure an ohmic contact to an n-side electrode 34, and the material thereof may be an $In_xAl_yGa_{1-x-y}N$. The n-type cladding layer 18 and the p-type cladding layer 22 serve to confine light in the active layer 20, and must have a lower refractive index than that of the active layer 20. The materials of the n-type cladding layer 18 and the p-type cladding layer 22 may be an $In_xAl_yGa_{1-x-y}N$ having a wider band gap than that of the active layer 20. The active layer 20 is a semiconductor layer, which is designed to emit light when carriers injected into the light device are recombined. The material of the active layer 20 may be an undoped $In_xAl_yGa_{1-x-y}N$. The p-type contact layer 24 is a p-type semiconductor layer having a high carrier concentration so as to ensure an ohmic contact to a p-side electrode, and the material thereof may be an $In_xAl_yGa_{1-x-y}N$. On the p-type contact layer 24, a p-side electrode layer 26 is deposited, and on the n-type contact layer 16, an n-side electrode layer 34 is deposited.

On a part of the p-type contact layer 24, a current blocking layer 30 is formed. On the current blocking layer 30, an Au electrode 32 is deposited. A part of the Au electrode 32 contacts the p-side electrode layer 26 serving as a second electrode. The Au electrode 32A serves as a bonding pad, to which a wire for supplying driving current to the light emitting device is bonded.

The current blocking layer 30 serves to prevent light from being emitted below the Au electrode 32A having a shading characteristic.

That is, in the light emitting device shown in FIGS. 1A and 1B, the light emitted from the active layer 20 is designed to penetrate the electrode layer 26 to be extracted from the top surface. However, the bonding pad portion 32A does not allow light to penetrate since the layer is thick. Therefore, the light generated below the electrode 32A can not be extracted to the outside to be useless. Accordingly, the current blocking layer 30 is provided for preventing driving current from being injected into a portion below the electrode 32A, so as to improve the external quantum efficiency.

Also on the n-side electrode layer 34, a bonding pad 32B is stacked. The bonding pad 32B can be formed by thickly depositing Au on the n-side electrode layer 34. The surface portion other than the bonding pads 32A, 32B are covered with a silicon oxide layer 45.

In the first preferred embodiment of the present invention, the n-type electrode layer 34 is formed by depositing a metal containing at least one of Group IV and VI elements. The Group IV or VI element serves as a dopant for raising the carrier concentration in the n-type contact layer 16. However, it was found by the inventors' experiments that, if the Group IV or VI element was deposited directly on the n-type contact layer 24, it was very easily peeled off. As a result of various trial manufactures, it was found that, if a metal, such as gold, was alloyed with the Group IV or VI element to be deposited, it was possible to obtain very good results. That is, it was possible to sufficiently decrease the contact resistance of the electrode while maintaining the sufficient bond strength to the n-type contact layer 16. It is assumed that the bond strength of the electrode is maintained by the function of the metal, such as gold, serving as a host metal. It is also assumed that the reason why the contact resistance decreases is that the Group IV or VI element penetrates into the surface region of the n-type contact layer 16 to be diffused therein to increase the carrier concentration thereof.

According to the present invention, the Group IV or VI element is preferably an element, which is easily alloyed with the host metal and which is easily diffused in the n-type contact layer 16 to form a donor.

It was found by the inventors' experiments that good results were obtained when any one of carbon (C), silicon (Si), germanium (Ge), tin (Sn) and lead (Pb) was used as the Group IV element. In particular, carbon and silicon of these elements significantly decreased the contact resistance.

On the other hand, it was found that good results were obtained when any one of oxygen (O), sulfur (S), selenium (Se), tellurium (Te) and polonium (Po) was used as the Group VI element. In particular, oxygen, sulfur and selenium of these elements significantly decreased the contact resistance.

The host metal alloyed with any one of these additional elements is preferably a metal, which is easily alloyed with the additional element and which has an excellent bond strength to the n-type contact layer 16. In particular, the host metal is preferably a metal, which forms a solid solution with the additional element to obtain a uniform alloy.

It was found by the inventors' experiments that good results were obtained when any one of nickel (Ni), silver (Ag), titanium (Ti), aluminum (Al) and platinum (Pt), in addition to gold, was used as the host metal.

A method for fabricating the light emitting device 10 in the first preferred embodiment according to the present invention will be described below.

FIGS. 2A through 2D, 3A through 3D and 4A through 4C are schematic sectional views illustrating a process for fabricating the light emitting device 10 in the first preferred embodiment according to the present invention.

Figure 2A:
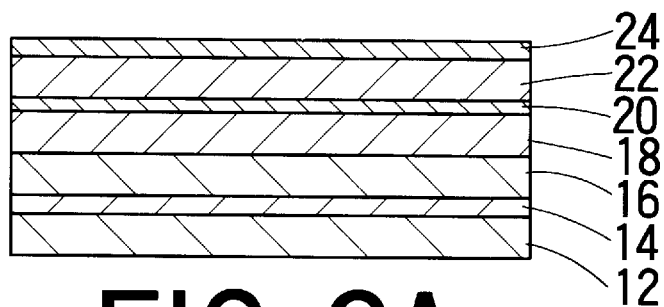
FIGS. 2A through 2D are schematic sectional views schematically illustrating a part of a process for fabricating the first preferred embodiment of a light emitting semiconductor device according to the present invention.

First, as shown in FIG. 2A, semiconductor layers 14, 16, 18, 20, 22 and 24 are sequentially epitaxial-grown on a sapphire substrate 12. This growth method may be the molecular beam epitaxy (MBE) or the metal organic chemical vapor deposition (MOCVD).

Figure 2B:
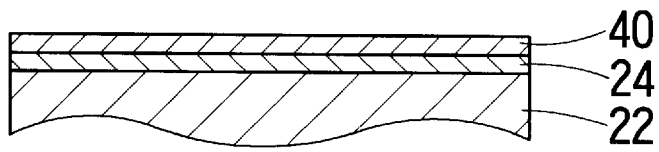

Then, as shown in FIG. 2B, a silicon oxide film 40 serving as a mask for the dry etching is deposited on the surface of the uppermost layer 24.

Figure 2C:
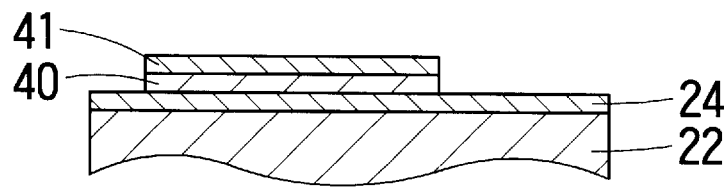

Then, as shown in FIG. 2C, the silicon oxide film 40 is patterned using a resist 41.

Figure 2D:
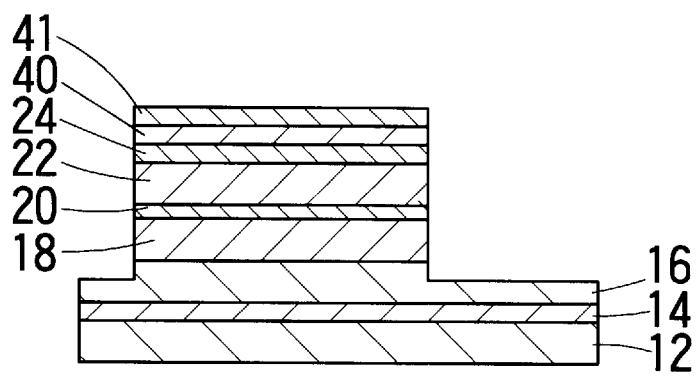
Figure 3A:
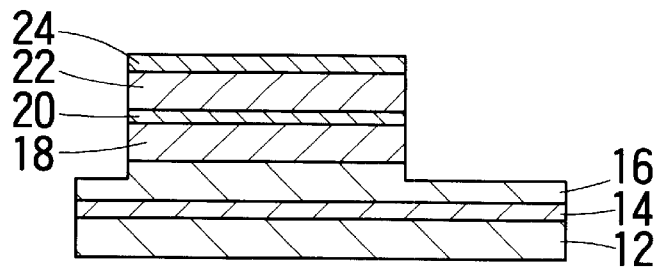
FIGS. 3A through 3D are schematic sectional views schematically illustrating a part of a process for fabricating the first preferred embodiment of a light emitting semiconductor device according to the present invention.

Subsequently, as shown in FIG. 2D, the silicon oxide film 40 and the resist 41 are used as a mask, and a part of the semiconductor layer is dry-etched into the n-type contact layer 16. Then, as shown in FIG. 3A, the silicon oxide film 40 and the resist 41 are removed.

Figure 3B:
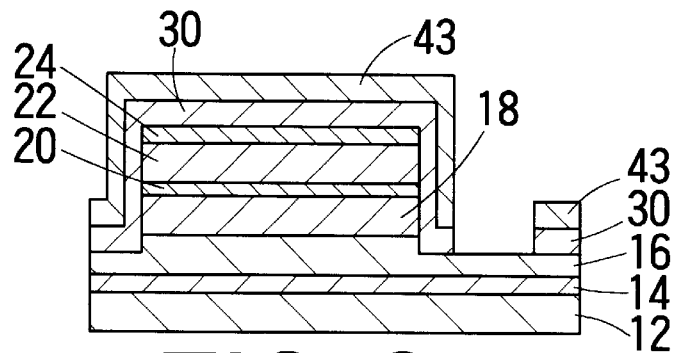

Subsequently, as shown in FIG. 3B, a silicon oxide film 30 is deposited, and patterned using a resist 43 to form a mask for patterning a n-side electrode.

Figure 3C:
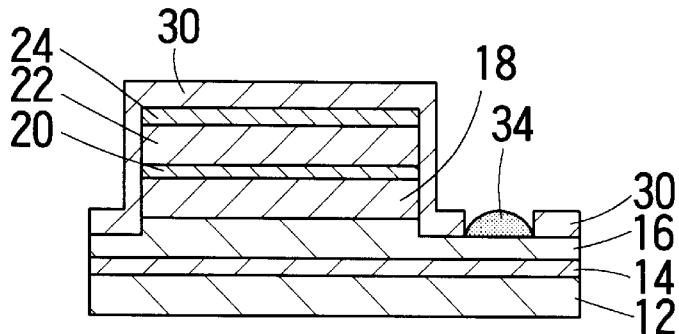

Then, as shown in FIG. 3C, an n-side electrode 34 of, e.g., Au-2% Si, is deposited. This deposition method may be the sputtering method. The deposited electrode film is patterned by the lift off technique using the resist 43. Moreover, the ohmic contact of the n-side electrode 34 is formed by the heat treatment.

In the inventors' experiments, there were some cases where the electrode was peeled off if the electrode was formed by a vacuum evaporation method using the resistance heating evaporation furnace and an alloy of a host metal, such as gold, with a Group IV or VI element was employed as a source material. It is assumed that this is caused by the difference in a vapor pressure between these metal elements. That is, the equilibrium vapor pressure of the host metal, such as gold, used for the present invention is often much lower than those of the Group IV and VI elements serving as additional elements. For example, although the equilibrium vapor pressure of gold is about $5 \times 10^{-10}$ Torr at 1000° C., the equilibrium vapor pressure of selenium is higher than or equal to $10^3$ Torr at 1000° C., so that the latter is higher than $10^{13}$ times as high as the former. In such a case, if an alloy of these elements is used as a source material to carry out vacuum evaporation using the resistance heating evaporation furnace, selenium having a high vapor pressure is preferentially vaporized to be deposited on the surface of the n-type contact layer 16. As a result, the electrode may be easily peeled off.

Therefore, the deposition method of the n-side electrode 34 using an alloy as a source material is preferably the sputtering deposition method. That is, if the sputtering deposition method is used, there is an advantage in that an electrode having a uniform composition distribution can be deposited even if the equilibrium vapor pressures of the respective elements of the alloy are significantly different.

However, when the equilibrium vapor pressures of the respective elements of the alloy are not so different, the deposition may be carried out by the resistance heating method. For example, when gold is selected as the host metal and silicon is selected as the Group IV element, both have substantially the same equilibrium vapor pressures. Therefore, even if the alloy of gold with silicon is deposited by the resistance heating evaporation furnace, the electrode is not peeled off by extreme segregation as described above. According to the resistance heating method, there is an advantage in that the deposition can be carried out without the need of an expensive target, which is required for the sputtering deposition method.

Alternatively, the n-side electrode 34 may be deposited by a so-called multi-source vacuum vapor deposition. That is, an alloy film may be deposited by separately vaporizing a host metal, such as gold, and a Group IV or VI element by means of separate evaporation sources. According to this method, the deposition rates of the host metal and the additional element can be separately controlled, so that there is an advantage in that it is possible to prevent the electrode from being peeled off by segregation to deposit an alloy electrode film having a predetermined composition. There is also an advantage in that it is not required to previously prepare an alloy serving as a raw material, so that it is possible to easily fabricate the light emitting device.

Thus, after the alloy film is deposited, the patterning is carried out, and the heat treatment is carried out. By this heat treatment, the Group IV or VI element contained in the n-side electrode 34 is diffused to penetrate into the surface layer of the n-type contact layer 16 to increase the carrier concentration, so that the contact resistance of the electrode 34 can be decreased. Moreover, the host metal forming the electrode 34 is alloyed with the n-type contact layer 16, so that the bond strength of the electrode is enhanced. The conditions for this heat treatment can be suitably set in accordance with the types of the host metal and additional element of the n-type electrode 34 and the composition and thickness thereof. If the heat treatment is not sufficiently carried out, the contact resistance is not sufficiently decreased, and the bond strength of the electrode is not enhanced. In addition, if the heat treatment was excessively carried out, the hose metal was excessively alloyed with the semiconductor layer to make the surface irregular, so that there was not a tendency for good characteristics to be obtained. For example, when Au-2% Si is used, the heat treatment conditions are preferably the flash annealing for about 40 seconds at a temperature of 800° C. to 900° C.

Figure 3D:
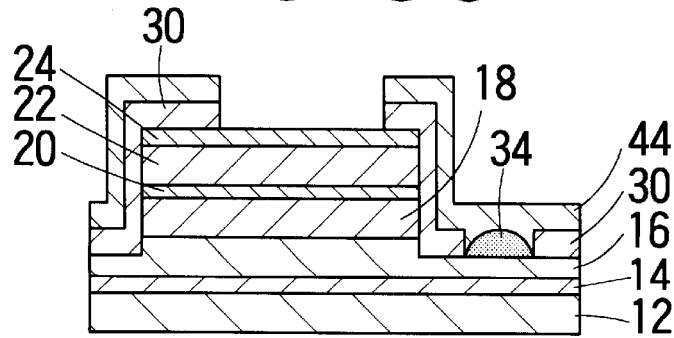

Thereafter, as shown in FIG. 3D, a resist 44 is deposited again and patterned to form a mask for patterning a p-side electrode.

Figure 4A:
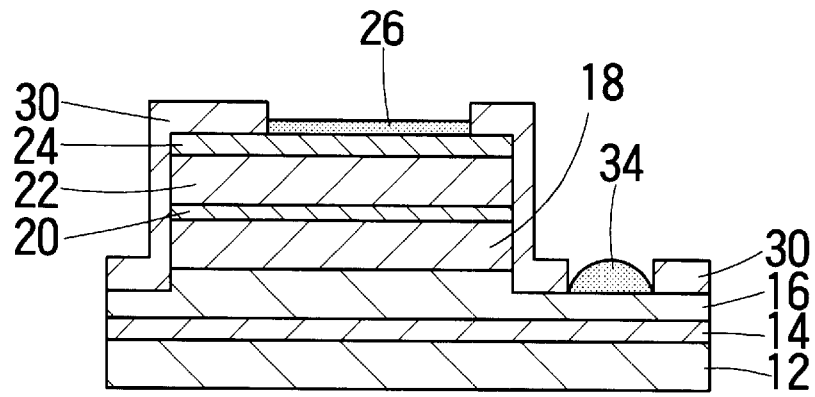
FIGS. 4A through 4C are schematic sectional views schematically illustrating a part of a process for fabricating the first preferred embodiment of a light emitting semiconductor device according to the present invention.

Then, as shown in FIG. 4A, a p-side electrode 26 is deposited, and patterned by the lift-off technique using the resist 44.

Figure 4B:
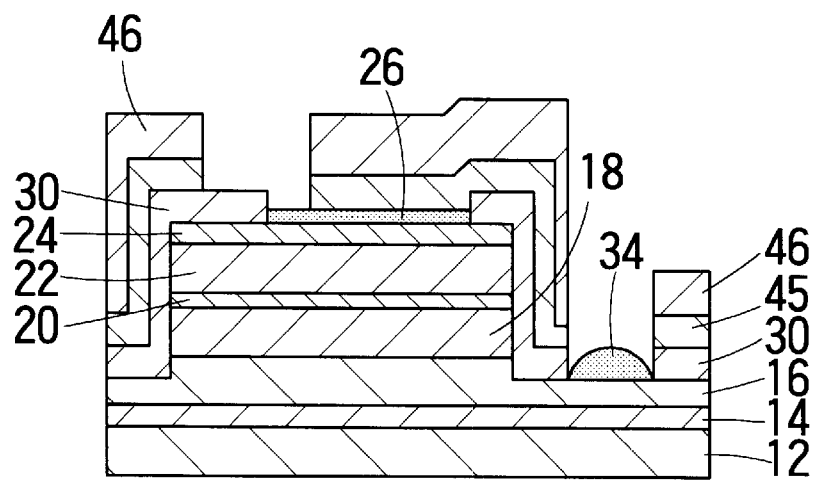

Then, as shown in FIG. 4B, a silicon oxide film 45 is deposited, and patterned by means of the a resist 46 to form a mask for a bonding metal.

Figure 4C:
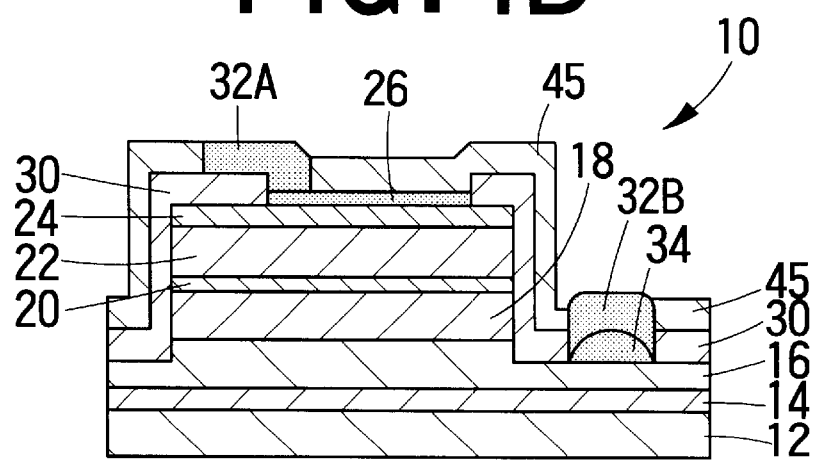

Subsequently, as shown in FIG. 4C, Au is evaporated, and the patterning is carried out by the lift-off technique using the resist 46. By this patterning, Au layers 32A, 32B for bonding are formed on the p-side electrode and the n-side electrode, respectively.

Thereafter, the light emitting device formed on the sapphire substrate 12 by the above described process is divided by cleavage or scribing, and each of the divided chips is mounted on a stem, a chip carrier or a packaging substrate by a predetermined method. Then, wires are bonded to the p-side electrode and the n-side electrode, so that the fabrication of a light emitting device is completed.

It was found that the blue light emitting device thus obtained had a lower operating voltage and a lower differential resistance than those of conventional light emitting devices because the contact resistance of the n-side electrode was significantly decreased. That is, while a carrier concentration as low as $1\times10^{17}$ to $1\times10^{19}$ cm$^{-3}$ was set during the crystal growth so as to prevent the deterioration of the surface morphology of the n-type contact layer 16, it was possible to increase the carrier concentration after the crystal growth.

The blue light emitting device according to the present invention had a higher saturated level of optical output power and better temperature characteristics than those of conventional light emitting devices, and could be operated at a higher temperature than those of conventional light emitting devices. It was also found that the light emitting device according to the present invention had a longer lifetime than those of conventional light emitting devices. It is considered that the reason for this is that the calorific amount is smaller than those of conventional light emitting devices since the operating voltage is low, so that a decrease in the optical output power due to heat generation and a decrease of the lifetime of the light emitting device are prevented.

Moreover, it was found that the blue light emitting device according to the present invention did not cause the peeling of the electrode and had substantially the same yield in the wire bonding step as those of conventional light emitting device.

That is, according to the present invention, it is possible to decrease the contact resistance while inhibiting the peeling of the electrode, so that it is possible to improve the emission characteristics and lifetime of the light emitting device.

The second preferred embodiment of a light emitting semiconductor device according to the present invention will be described below.

Figure 5A:
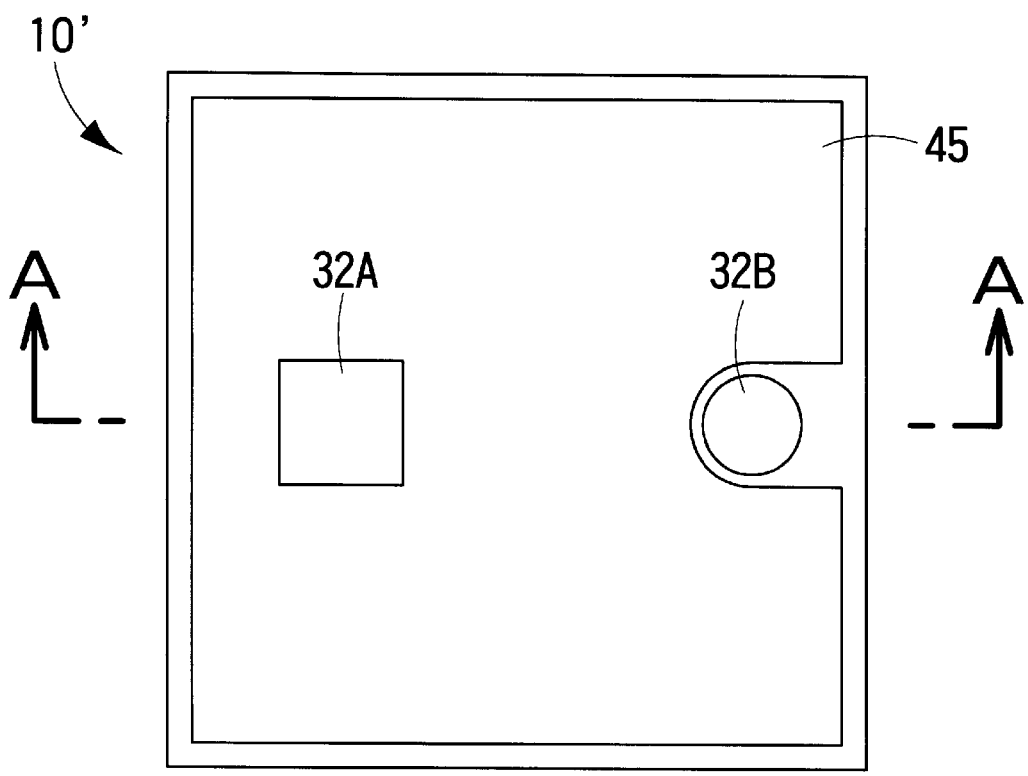
FIG. 5A is a schematic plan view of the second preferred embodiment of a light emitting semiconductor device according to the present invention.
Figure 5B:
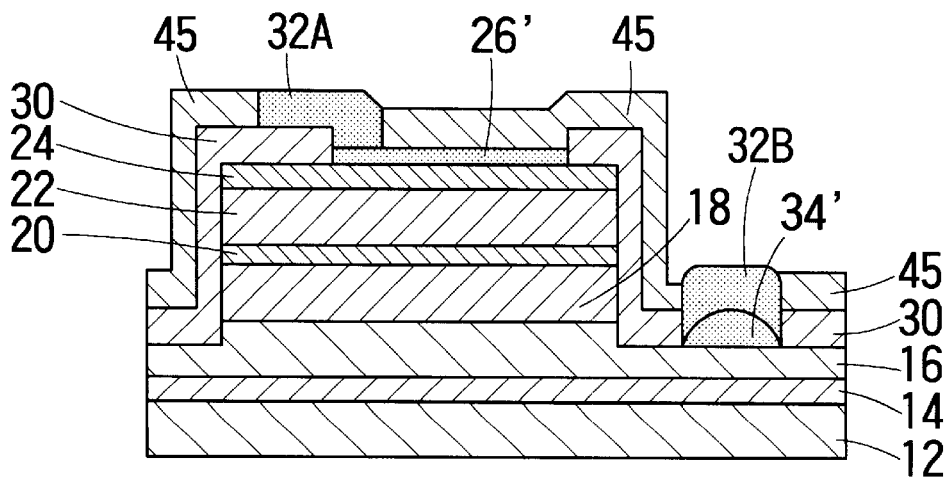
FIG. 5B is a schematic sectional view thereof.

FIG. 5A is a schematic plan view of the second preferred embodiment of a light emitting semiconductor device according to the present invention, and FIG. 5B is a schematic sectional view taken along line A—A of FIG. 5A. In these figures, a light emitting device 10' is a light emitting gallium nitride device for emitting a light having a waveband of ultraviolet to green.

The schematic construction of the light emitting device in this preferred embodiment is substantially the same as that of the light emitting device 10 shown in FIGS. 1A and 1B, so that the same reference numbers are used for the same or corresponding portions to omit the detailed descriptions thereof.

In this preferred embodiment, the light emitting device 10' is characterized by a p-side electrode 26' and an n-side electrode 34'. That is, in this preferred embodiment, a conductive electrode 26' is deposited on a p-type contact layer 24, and a conductive electrode layer 34' is deposited on a n-type contact layer 16. Thereafter, impurities are injected into the respective contact layers 24, 16 by the ion implantation, and the heat treatment is carried out.

According to this preferred embodiment, the ion implantation of dopant can be carried out from the top of each of the electrode layers, so that it is possible to inhibit the crystal of the semiconductor layer from being damaged by the ion implantation. In addition, the penetration depth of the injected dopant is decreased due to the presence of the electrode layer, so that it is possible to form a region having a high carrier concentration near the surface layers of the respective contact layers 24, 16 to effectively decrease the contact resistance. Moreover, since the ion implantation is carried out from the top of each of the electrode layers 26' and 34', the mixing of the electrode layers 26', 34' with the respective contact layers 24, 16 occurs, so that it is possible to improve the bond strength of the electrodes.

Preferably, the materials of the electrode layers 26', 34' have a high bond strength to the contact layers 24, 16. Such materials may include carbon (C), germanium (Ge), selenium (Se), rhodium (Rh), tellurium (Te), iridium (Ir), zirconium (Zr), hafnium (Hf), copper (Cu), titanium nitride (TiN), tungsten nitride (WN), molybdenum (Mo) and titanium silicide (TiSi).

Among these elements and compounds, rhodium and iridium can tightly contact a semiconductor layer to inhibit the electrode peeling.

Since carbon, germanium, selenium and tellurium are dopant materials of a semiconductor layer, these elements are conformable with the semiconductor layer, and have good ohmic characteristics since the amount of the oxide film formed in the interface of the electrode and so forth is very small.

Since an electrode of copper can be formed without penetrating into a nitride semiconductor layer, copper has excellent heat sink effects and can further improve the temperature characteristics of the device. When zirconium or hafnium is used, there is an advantage in that it is possible to inhibit the penetration of a Group I element, which forms a non-radiative center in the semiconductor.

When molybdenum is used, there are advantages in that it is possible to provide an electrode having excellent adhesion and capable of resist to the heat treatment at a high temperature and it is possible to inhibit the dissociative evaporation of nitrogen from occurring from the underlayer semiconductor.

When titanium nitride or tungsten nitride is used, there are advantages in that it is possible to carry out the heat treatment at a high temperature to inhibit the dissociative evaporation of nitrogen from occurring from the underlayer semiconductor due to the heat treatment, and it is possible to further increase the carrier concentration of the contact layer to reduce the contact resistance.

When titanium silicide is used, there are advantages in that it is possible to inhibit a metal material, such as Au, of a bonding pad from being diffused to penetrate into the semiconductor layer and it is possible to improve the surge voltage resistance of the light emitting device.

The impurity for the ion implantation is preferably a dopant for increasing the carrier concentration in the respective contact layers 24, 16.

Such impurities may include Group II elements for the p-type contact layer 24. In the inventors' experiments, good results were obtained when any one of beryllium (Be), magnesium (Mg) and zinc (Zn) was used. Because these elements tend to form an acceptor in a Group III–V semiconductor, and the deterioration of the crystallinity of the contact layer is small. In addition to the above elements, any one of calcium (Ca), strontium (Sr), cadmium (Cd) and mercury (Hg) may be used.

Impurities for the n-type contact layer 16 may include Group IV and VI elements. In the inventors' experiments, good results were obtained when any one of carbon (C), silicon (Si), tin (Sn), sulfur (S), selenium (Se) and tellurium (Te) was used.

A method for producing the light emitting device 10' in the second preferred embodiment of the present invention will be described below.

FIGS. 6A through 6D, 7A through 7E and 8A through 8D are schematic sectional views illustrating a process for fabricating the light emitting device 10' in the second preferred embodiment of the present invention.

Figure 6A:
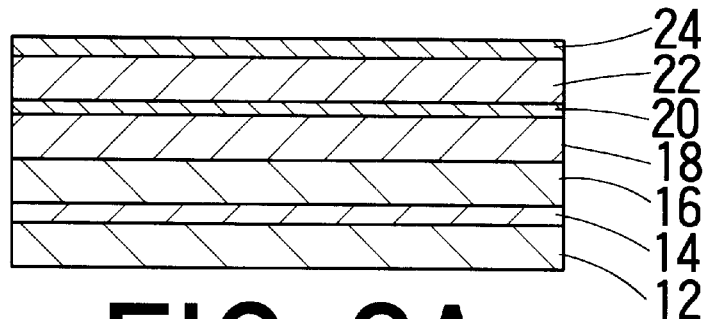
FIGS. 6A through 6D are schematic sectional views schematically illustrating a part of a process for fabricating the second preferred embodiment of a light emitting semiconductor device according to the present invention.
Figure 6B:
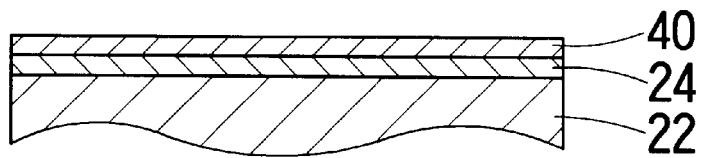
Figure 6C:
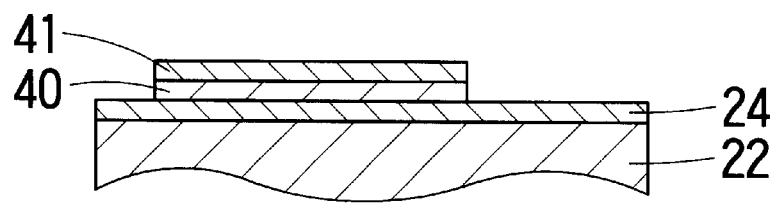
Figure 6D:
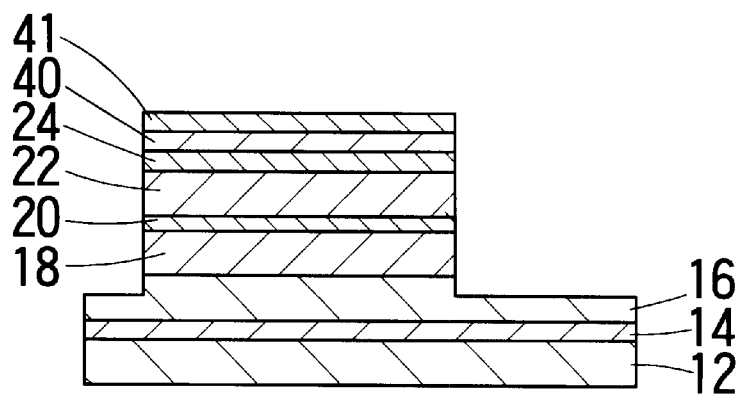

First, as shown in FIG. 6A, semiconductor layers 14, 16, 18, 20, 22 and 24 are sequentially epitaxial-grown on a sapphire substrate 12. For example, the metal organic chemical vapor deposition (MOCVD) may be used as this growth method.

A series of subsequent steps shown in FIGS. 6B through 6D, 7A and 7B are substantially the same as those shown in FIGS. 2B through 2D, 3A and 3B. Therefore, the same reference numbers are used for the same portions, and the descriptions thereof are omitted.

Figure 7A:
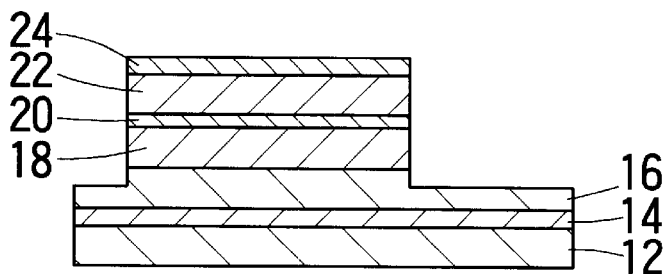
FIGS. 7A through 7E are schematic sectional views schematically illustrating a part of a process for fabricating the second preferred embodiment of a light emitting semiconductor device according to the present invention.
Figure 7B:
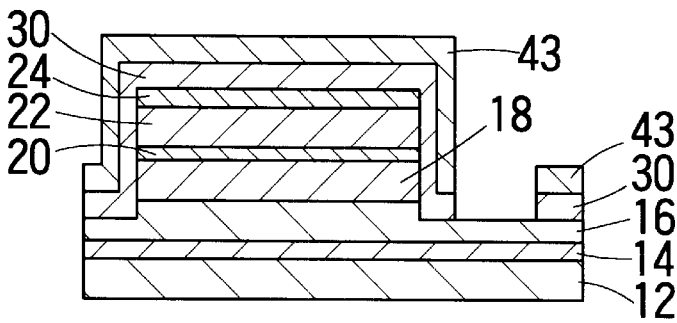
Figure 7C:
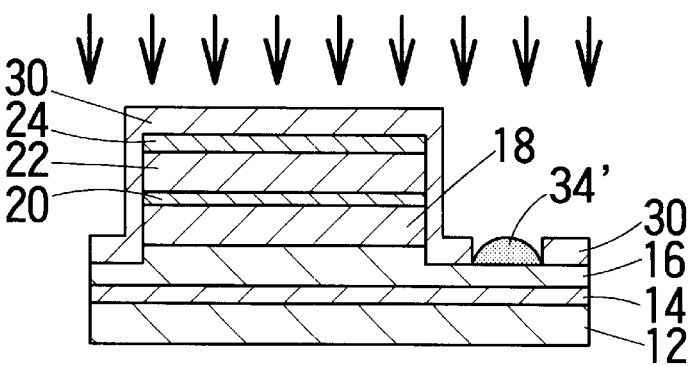

One of the features of this preferred embodiment is a step of forming a p-side electrode shown in FIG. 7C. That is, as shown in FIG. 7C, an n-side electrode 34' is deposited. This deposition method may be any one of the electron beam deposition method, the resistance heating method and the sputtering method. The deposited electrode film is patterned by the lift-off technique using a resist 43. Then, impurities of, e.g., silicon, are implanted by the ion implantation. At this time, the implanted impurities pass through the electrode 34' to penetrate into the surface region of the n-type contact layer 16. Since a silicon oxide film 30 serves as a mask for other portions, the implanted impurities do not penetrate into the semiconductor layer 24.

Figure 7D:
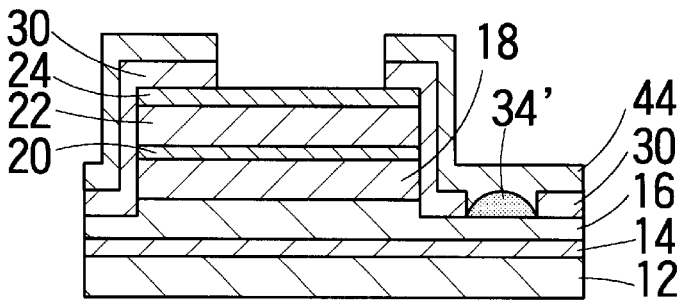

Then, as shown in FIG. 7D, a resist 44 is deposited again, and the patterning is carried out to form a mask for the lift-off of a p-side electrode.

Figure 7E:
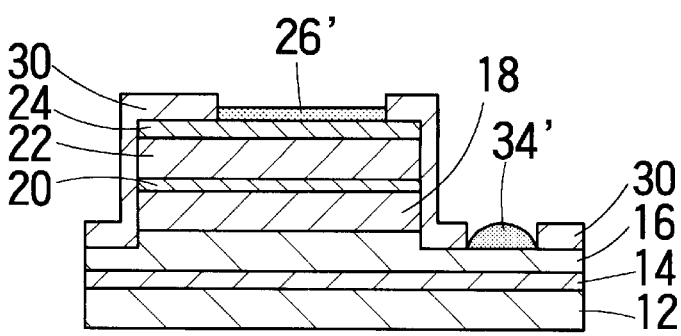

Then, as shown in FIG. 7E, a p-side electrode 26' is deposited, and the patterning is carried out by the lift-off technique using the resist 44. The deposition method of the p-side electrode 26' may be any one of the electron beam deposition method, the resistance heating method and the sputtering method.

Figures 8A, 8B, 8C, 8D:
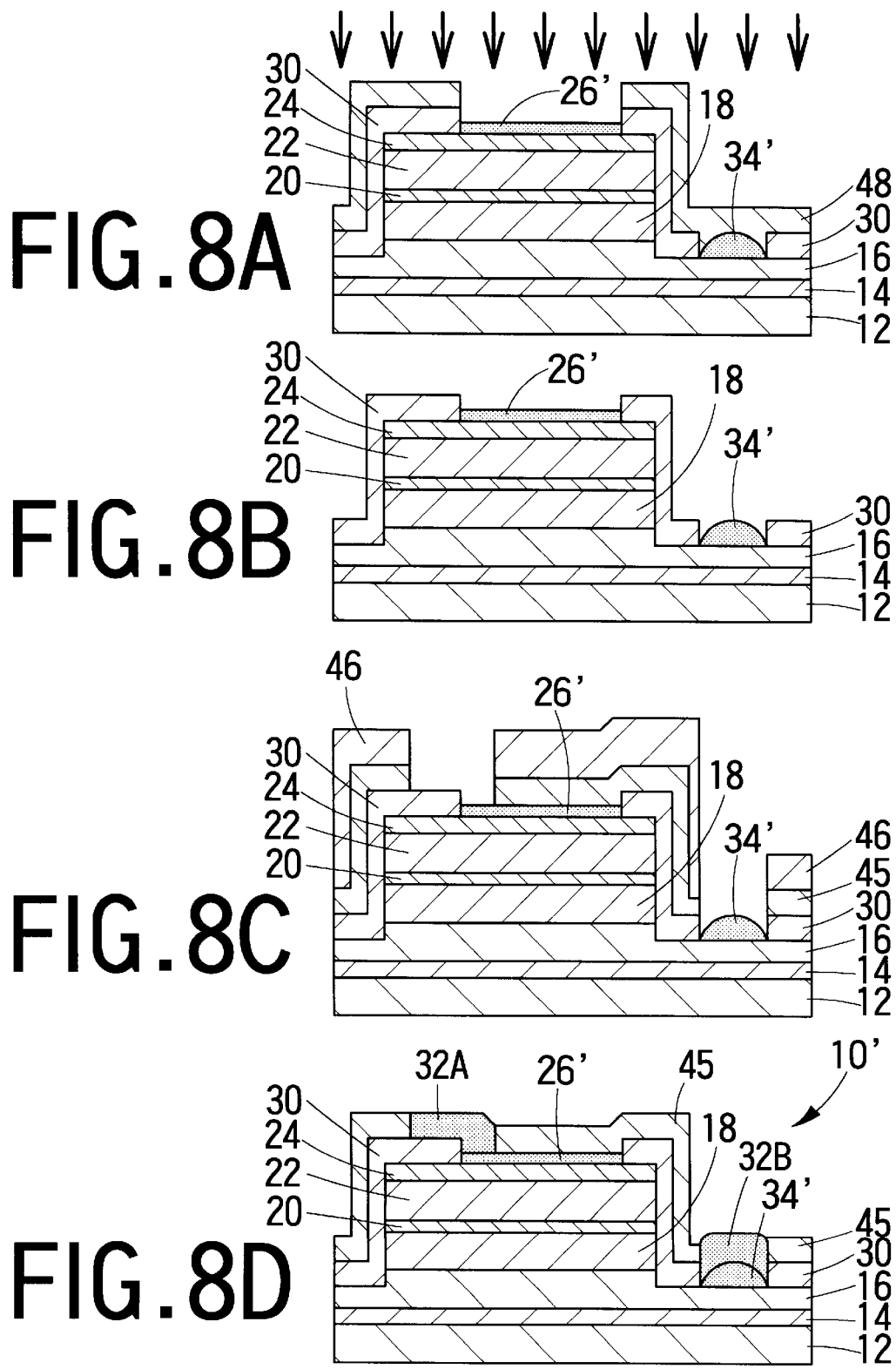
FIGS. 8A through 8D are schematic sectional views schematically illustrating a part of a process for fabricating the second preferred embodiment of a light emitting semiconductor device according to the present invention.

Thereafter, as shown in FIG. 8A, a silicon oxide 48 is deposited, and the patterning is carried out to form a mask for the ion implantation. Then, impurities of, e.g., magnesium, are implanted by the ion implantation. At this time, the implanted impurities pass through the electrode 26' to penetrate into the surface layer of the p-type contact layer 24. Since a silicon oxide film 48 serves as a mask for other portions, the implanted impurities do not penetrate into the n-side electrode 34' and the semiconductor layer 16.

Moreover, the heat treatment is carried out to restore the crystallinity of the contact layers 16 and 24, to which the impurities have been implanted, and to activate the implanted impurity portion. By this heat treatment, the injected impurities contained in the electrodes 26' and 34' can be diffused to penetrate into the contact layers 24, 16, respectively, to increase the carrier concentration. It is required to suitably determine the optimum conditions for the heat treatment on the basis of the kind of the impurity and the conditions of the ion implantation. It was found by the inventors' experiments that, when the heat treatment was carried out for 5 seconds (the flash annealing may be used) to 60 minutes at a temperature of 400°0 C. to 1200° C., the crystallinity of the n-type contact layer 16 and p-type contact layer 24 was restored and the implanted impurities were sufficiently activated.

Subsequently, as shown in FIG. 8B, the silicon oxide layer 48 is removed.

Then, as shown in FIG. 8C, a silicon oxide layer 45 is newly deposited, and patterned by means of a resist 46 to form a mask for a bonding metal.

Then, as shown in FIG. 8D, Au is deposited, and the patterning is carried out by the lift-off technique using the resist 46. By this patterning, bonding pads 32A, 32B are formed on the p-side electrode 26' and the n-side electrode 34'.

Thereafter, the light emitting device formed on the sapphire substrate 12 by the above described process is divided by cleavage or scribing, and each of the divided device is mounted on a stem, a chip carrier or a packaging substrate by a predetermined method. Then, wires are bonded to bonding metals deposited on the p-side electrode and the n-side electrode, so that the fabrication of the light emitting device 10' is completed.

The inventors carried out various experiments by changing the thickness of the electrode and the conditions for the ion implantation when the p-side electrode 26' and the n-side electrode 34' are formed in this preferred embodiment.

Figure 9:
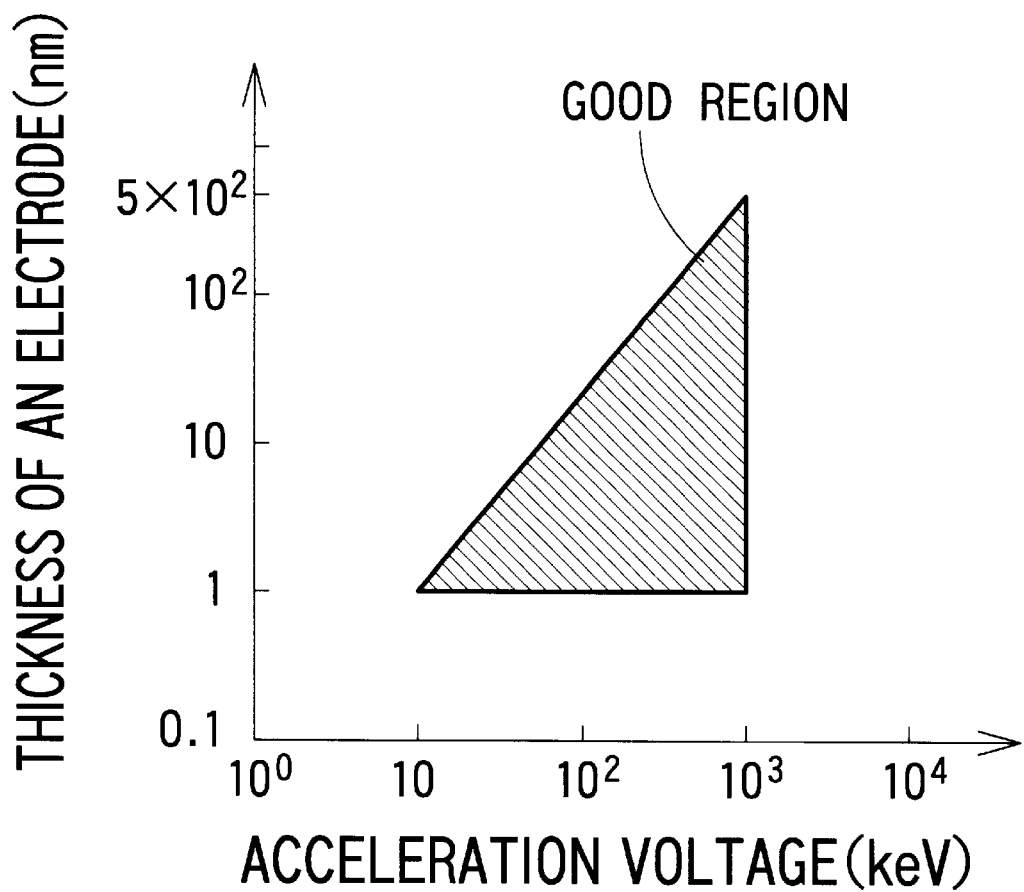
FIG. 9 is a graph showing the results obtained when the thickness of an electrode and the ion implantation conditions are changed according to the present invention.

The results of these experiments are shown in the graph of FIG. 9. In this graph, the horizontal axis shows the acceleration voltage during the ion implantation, and the vertical axis shows the thickness of the electrode. The region shown by the hatched lines in the graph shows conditions wherein both of the contact resistance and bond strength of the electrode are good. On the left side of the hatched-line region in FIG. 9, the implanted impurities did not reach the contact layer, and the contact resistance was not sufficiently decreased. On the right side of the hatched-line region in FIG. 9, the acceleration voltage was too high, so that the crystallinity of the contact layer was excessively damaged and the contact resistance was not sufficiently decreased even if the heat treatment was carried out. That is, it was found that good results were obtained when the acceleration voltage was in the range of from 10 to 1000 keV and the thickness of the electrode was in the range of from 1 to 50 nm, and that both depended on each other.

The optimum dose during the ion implantation depends on the thickness of the electrode and the acceleration voltage. In the inventors' experiments, good results were obtained in a dose of $1\times10^{13}$ to $1\times10^{17}$ ions/cm$^2$ in accordance with the aforementioned ranges of the thickness of the electrode and the acceleration voltage.

The inventors manufactured a blue light emitting GaN device by way of experiment in this preferred embodiment, and the characteristics of the manufactured element were compared with those of conventional light emitting devices.

Figure 10A:
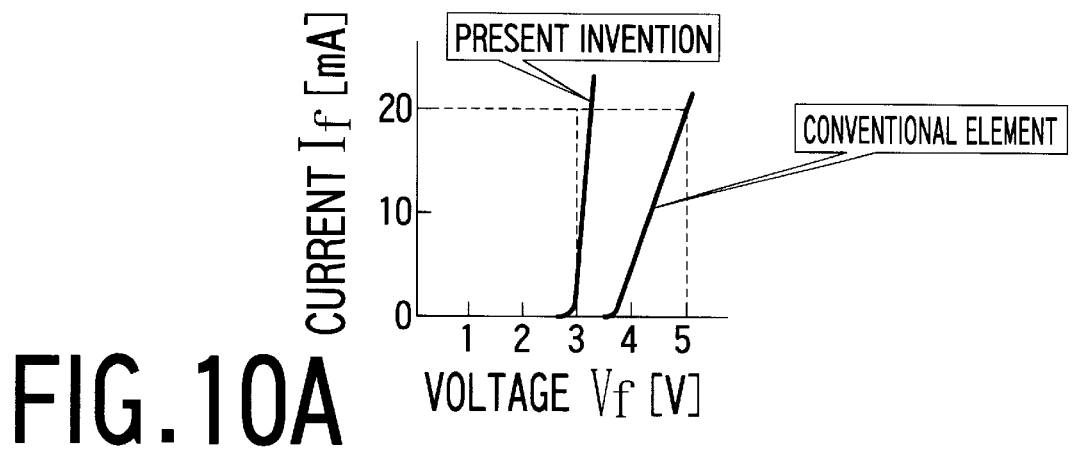
FIGS. 10A through 10C are characteristic diagrams of a light emitting semiconductor device according to the present invention.
Figure 10B:
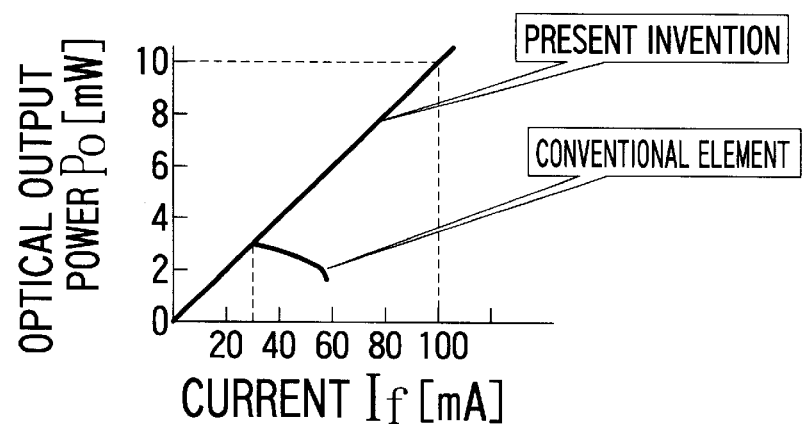
Figure 10C:
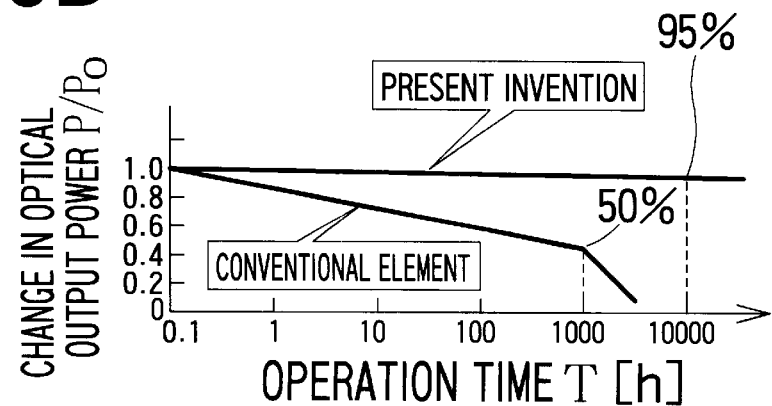

FIGS. 10A through 10C are characteristic diagrams of a light emitting semiconductor device according to the present invention in comparison with those of a conventional light emitting device. That is, FIG. 10A is a current/voltage characteristic diagram, FIG. 10B is a current/optical output power characteristic diagram, and FIG. 10C is a reliability characteristic diagram.

The manufactured light emitting device corresponds to the light emitting device in the second preferred embodiment. The stacked structure of the light emitting device was the same as that shown in FIGS. 5A and 5B. A p-side electrode of molybdenum having a thickness of 10 nm was deposited, and magnesium was injected into the p-side electrode by the ion implantation. The acceleration voltage for the ion implantation was 200 keV, and the dose was $1\times10^{16}$ ions/cm$^2$. After the ion implantation, the heat treatment was carried out for 5 minutes at 800° C.

In addition, an n-side electrode of titanium silicide having a thickness of 10 nm was deposited, and silicon was injected into the n-side electrode by the ion implantation. That acceleration voltage for the ion implantation was 200 keV, and the dose was $1\times10^{16}$ ions/cm$^2$. After the ion implantation, the heat treatment was carried out for 30 seconds at 1100° C.

In the case of the conventional light emitting device manufactured to be compared with the light emitting device of the present invention, the p-side electrode is formed of Au, and the structure and fabricating process of the light emitting device were the same as those of the light emitting device according to the present invention.

As shown in FIG. 10A, both of the operating voltage and differential resistance of the light emitting device were lower than those of the conventional light emitting device. For example, when the current value was 20 mA, although the operating voltage of the conventional light emitting device was 5 V, the operating voltage of the light emitting device according to the present invention was 3.3 V, which was lower than that of the conventional light emitting device. In addition, the inclination after rise of the operating voltage of the light emitting device according to the present invention was greater than that of the conventional light emitting device, so that the differential resistance of the light emitting device according to the present invention was lower than that of the conventional light emitting device.

According to the present invention, since the operating voltage is low, the emission characteristics can be considerably improved. That is, as shown in FIG. 10B, the optical output power of the conventional light emitting device was saturated at an operating current of about 30 mA, so that it was not possible to obtain an optical output power of higher than or equal to 2 mW. On the other hand, according to the present invention, the optical output power was not saturated at an operating current of up to 100 mA, so that it was possible to obtain an optical output power of higher than or equal to 8 mW. The improvement of the optical output power according to the present invention results from the low operating voltage. That is, according to the present invention, since the operating voltage is lower than that of the conventional light emitting device, the heat generated by the operating current is low, so that the emission characteristics are difficult to deteriorate due to the generated heat.

According to the present invention, it is also possible to considerably improve the lifetime of the light emitting device. That is, as shown in FIG. 10C, the optical output power of the conventional light emitting device continuously deteriorated immediately after the light emitting operation was started. This initial deterioration occurred in the non-radiative center. That is, in the case of the conventional light emitting device, since the contact resistance of the electrode is high, the calorific amount is large, so that the impurity element, such as the material of the electrode, is diffused to penetrate into the semiconductor layer during operation. Such diffusion and penetration of the impurity element are thermally activated to be accelerated if the calorific amount of the light emitting device is large. The impurity element diffused to penetrate into the semiconductor layer forms a non-radiative recombination center as a deep level to decrease the emission efficiency. Thus, the initial deterioration occurs.

Moreover, in the case of the conventional light emitting device, the optical output power rapidly deteriorates after a continuous operating time of about 1000 hours. Because crystal defects are gradually formed by the recombination energy, which is generated in the non-radiative center, to be grown to reach the active layer of the light emitting device. Such growth of crystal defects is also promoted if the calorific amount of the light emitting device is large. On the other hand, in the case of the light emitting device of the present invention, the optical output power is very stable for an operating time of 10000 hours or more. That is, even after 10000 hours, the optical output is about 95% of the initial value. The reason why the light emitting device of the present invention has such excellent reliability is that the contact resistance is low. That is, because the calorific value of the light emitting device is very low, so that the diffusion and penetration of the impurity element serving as the non-radiative center and the crystal defects are difficult to occur.

According to the present invention, it is also possible to significantly improve the adhesion of the p-side electrode. That is, in the case of the conventional light emitting device using the Au electrode, there are some cases where about 80% of the electrode is peeled off in the wire bonding step. On the other hand, in the case of the light emitting device according to the present invention, the percentage of the peeled electrode in the wire bonding step is less than or equal to 1%, so that the fabrication yield can be considerably improved.

According to the present invention, it is also possible to improve the surge voltage resistance. That is, in the case of the conventional light emitting device, since the contact resistance of the electrode is high and the bond strength of the electrode is insufficient, the surge voltage resistance decreases, so that the measured value based on EIAJ Standard is only about 50 V. On the other hand, in the case of the light emitting device according to the present invention, since both of the contact resistance and bond strength of the electrode are improved, the measured value based on EIAJ Standard is considerably improved to a value of not less than 300 V.

According to the present invention, there is also an advantage in that it is possible to reduce the contact resistance without deteriorating the crystallinity of the semiconductor layer and the surface morphology. That is, in the case of the conventional structure, it is required to dope a high density of dopant into the contact layer to rise the carrier concentration in order to decrease the contact resistance of the electrode. However, if such a high density of dopant is doped, there are problems in that the crystallinity of the contact layer deteriorates and the surface morphology deteriorates. According to the present invention, it is possible to increase the carrier concentration of the contact layer to decrease the contact resistance of the electrode without causing the above problems.

While each of the p-side electrode 26 (26') and the n-side electrode 34 (34') has been formed as a monolayer in FIGS. 1 and 5, the present invention should not be limited thereto. For example, at least one of the p-side electrode 26 (26') and the n-side electrode 34 (34') may be formed so as to have a stacked structure. That is, after depositing a thin layer of molybdenum or the like having excellent adhesion on a contact layer, a metal layer of titanium or the like serving as a barrier may be deposited thereon so as to prevent gold from being diffused in a bonding pad.

According to the present invention, the first preferred embodiment may be combined with the second preferred embodiment. That is, after depositing an n-side electrode 34 of, e.g., titanium silicide containing a Group IV element, a Group VI element, e.g., silicon, may be implanted thereon by the ion implantation, and then, the heat treatment may be carried out. Thus, both of the contact resistance and bond strength of the n-side electrode 34 can be further improved.

Figure 11:
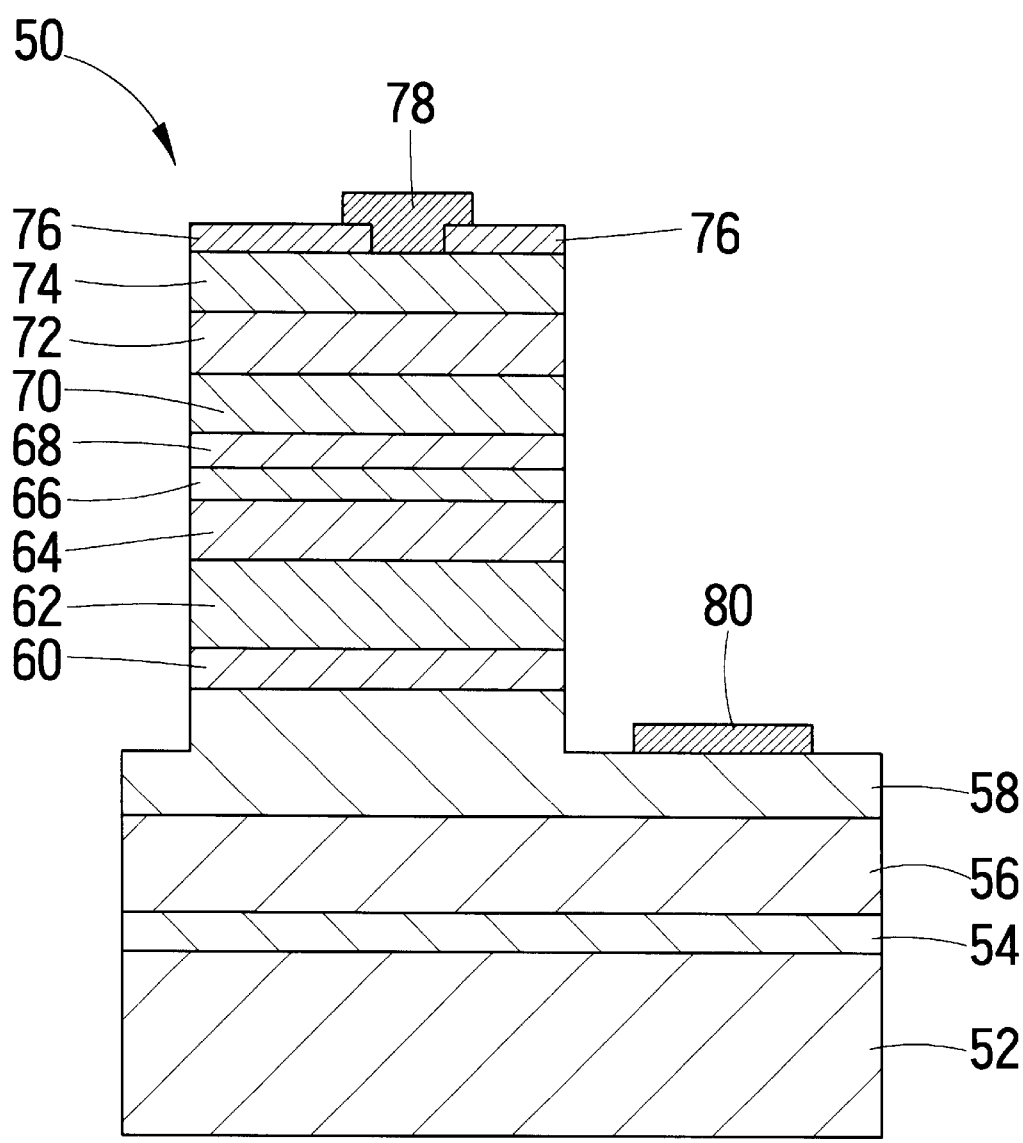
FIG. 11 is a schematic sectional view of the third preferred embodiment of a light emitting semiconductor device according to the present invention.

Referring to FIG. 11, the third preferred embodiment of a light emitting device according to the present invention will be described below.

FIG. 11 is a schematic sectional view of the third preferred embodiment of a light emitting semiconductor device according to the present invention. A light emitting device 50 shown in this figure is a multi-quantum well type blue light emitting semiconductor laser diode. The light emitting device 50 has a sapphire substrate 52, and a buffer layer 54 of GaN deposited thereon. Moreover, an undoped layer 56 of GaN, an n-type contact layer 58 of GaN, a crack preventing layer 60 of $In_{0.1}Ga_{0.9}N$, an n-type cladding layer 62 of $Ga_{0.85}Al_{0.15}N$, an n-type optical guiding layer 64 of GaN, a MQW (multi-quantum well) active layer 66 of $In_xGa_{1-x}N$ (x=0.2/0.05), a p-type cap layer to prevent evaporation 68 of $Ga_{0.88}Al_{0.12}N$, a p-type optical guiding layer 70 of GaN, a p-type cladding layer 72 of $Ga_{0.85}Al_{0.15}N$, and a p-type contact layer 74 of GaN are deposited thereon in this order.

The MQW layer 66 has a multi-quantum well structure wherein a crystal layer having an indium composition ratio x=0.2 of $In_xGa_{1-x}N$ and a crystal layer of x=0.05 thereof are stacked in 5 cycles so as to have thicknesses of 4 nm and 8 nm, respectively.

On the p-type contact layer 74, a p-side electrode 78 is formed via an insulating film 76. On the n-type contact layer, an n-side electrode 80 is formed.

On the respective electrodes, bonding pads (not shown) are formed by depositing gold. To these bonding pads, wires (not shown) for supplying driving current from the outside are bonded.

In order to produce the light emitting device 50 shown in FIG. 11, the respective semiconductor layers 54 through 74 may be epitaxial-grown on the sapphire substrate 52 by means of, e.g., the metal organic chemical vapor deposition (MOCVD) or the molecular beam epitaxy (MBE).

The steps of producing the light emitting device 50 are substantially the same as those shown in FIGS. 2A through 2D, 3A through 3D and 4A through 4C or 6A through 6D, 7A through 7E and 8A through 8D. Therefore, the detailed descriptions thereof are omitted.

The inventor formed the p-side electrode 78 and the n-side electrode 80 of the light emitting device 50 in this preferred embodiment. That is, the p-side electrode 78 of titanium nitride having a thickness of 10 nm was deposited, and zinc was implanted into the p-side electrode 78 by the ion implantation at an acceleration voltage of 100 keV in a dose of $1\times10^{16}$ ions/cm$^2$. Moreover, the annealing was carried out for 30 minutes at 750° C. Thus, it was possible to form the p-side electrode having good contact resistance and bond strength.

Moreover, two kinds of n-side electrodes 80 were formed. First, the n-side electrode 80 in the first preferred embodiment was formed by depositing titanium silicide so as to have a thickness of 100 nm, and the heat treatment was carried out for 40 seconds at 850° C. Then, the n-side electrode 80 in the second preferred embodiment was formed by depositing molybdenum so as to have a thickness of 100 nm, and sulfur was implanted by the ion implantation at an acceleration voltage of 150 keV in a dose of $1\times10^{16}$ ions/cm$^2$. Thereafter, the flash-annealing was carried out for 20 seconds at 1100° C.

In the light emitting element thus prepared, both of the n-side electrodes in the first and second preferred embodiments had very low contact resistance and good bond strength.

After the characteristics of the light emitting device 50 were evaluated, it was verified that the light emitting device 50 had the same advantages as those of the light emitting device 10' shown in FIG. 5. That is, the light emitting device 50 had a lower driving voltage and a higher optical output power than those of the conventional light emitting device, so that it was possible to improve the reliability, to inhibit the electrode from being peeled off, and to improve the surge resistance.

Moreover, it was possible to considerably improve the temperature characteristic of the light emitting device, which was a very important characteristic of a laser, so that it was possible to obtain continuous oscillation in a room temperature.

While each of the p-side electrode 78 and the n-side electrode 80 has been formed to have a monolayer electrode structure in FIG. 11, the present invention should not be limited thereto. For example, as described above, each of the electrode layers may have a stacked structure. On these electrode layers, third electrode layers (not shown) may be deposited.

The light emitting device 50 shown in FIG. 11 is only an example of semiconductor light emitting devices with the composition $In_xAl_yGa_{1-x-y}N$ ($0 \leq x \leq 1$, $0 \leq y \leq 1$, $x+y \leq 1$) according to the present invention. For example, the light emitting layer according to the present invention may comprises a graded layer having a refractive index, which gradually varies between the n-type cladding layer 62 and the p-type cladding layer 68. Moreover, the present invention may include a light emitting device having a structure wherein the conductive types of the respective semiconductor layers shown in FIG. 11 are reversed. The present invention may be also applied to all light emitting devices required to form an electrode in a semiconductor layer with the composition $In_xAl_yGa_{1-x-y}N$ ($0 \leq x \leq 1$, $0 \leq y \leq 1$, $x+y \leq 1$).

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A light emitting semiconductor device comprising:

a stacked structure having a plurality of compound semiconductor layers, which include at least an n-type $In_xAl_yGa_{1-x-y}N$ ($0 \leq x \leq 1$, $0 \leq y \leq 1$, $x+y \leq 1$) layer having a contact region; and a first metal layer deposited on said contact region of said n-type $In_xAl_yGa_{1-x-y}N$ layer of said stacked structure, said first metal layer containing as a major component thereof at least one element selected from the group consisting of gold (Au), nickel (Ni), silver (Ag), titanium (Ti), aluminum (Al) and platinum (Pt), and said first metal layer additionally containing at least one element component selected from the group consisting of Group IV and VI elements, wherein said element component of Group IV and VI elements contained in said first metal layer is diffused to penetrate into said contact region of said n-type $In_xAl_yGa_{1-x-y}N$ layer to increase a carrier concentration of said contact region to decrease a contact resistance to said first metal layer.

2. A light emitting semiconductor device as set forth in claim 1, wherein said Group IV elements include at least one element selected from the group consisting of carbon (C), silicon (Si), germanium (Ge), tin (Sn), and lead (Pb).

3. The light emitting semiconductor device as set forth in claim 2, wherein said first metal layer contains at least one element component selected from the group consisting of carbon (C) and silicon (Si).

4. A light emitting semiconductor device as set forth in claim 1, wherein said Group VI elements include at least one element selected from the group consisting of oxygen (O), sulfur (S), selenium (Se), tellurium (Te) and polonium (Po).

5. The light emitting semiconductor device as set forth in claim 4, wherein said first metal layer contains at least one element component selected from the group consisting of oxygen (O), sulfur (S), and selenium (Se).

6. A light emitting semiconductor device comprising:

a stacked structure having a plurality of compound semiconductor layers, which include at least an n-type $In_xAl_yGa_{1-x-y}N$ ($0 \leq x \leq 1$, $0 \leq y \leq 1$, $x+y \leq 1$) layer having a contact region; and a first metal layer deposited on said contact region of said stacked structure, said first metal layer being formed of at least one material selected from the group consisting of carbon (C), selenium (Se), tellurium (Te), titanium nitride (TiN), tungsten nitride (WN), and titanium silicide (TiSi), wherein at least one element component of Group IV and VI elements is ion-implanted into said contact region via said first metal layer to increase a carrier concentration of said contact region to decrease a contact resistance to said first metal layer.

7. A light emitting semiconductor device as set forth in claim 6, wherein said element component of Group IV and VI elements is selected from the group consisting of carbon (C), silicon (Si), tin (Sn), sulfur (S), selenium (Se) and Tellurium (Te).

8. A light emitting semiconductor device comprising:

a stacked structure having a plurality of compound semiconductor layers, which include at least a p-type $In_xAl_yGa_{1-x-y}N$ ($0 \leq x \leq 1$, $0 \leq y \leq 1$, $x+y \leq 1$) layer having a contact region; and a first metal layer deposited on said contact region of said stacked structure, said first metal layer being formed of at least one material selected from the group consisting of carbon (C), germanium (Ge), selenium (Se), rhodium (Rh), tellurium (Te), iridium (Ir), zirconium (Zr), hafnium (Hf), copper (Cu), titanium nitride (TiN), tungsten nitride (WN), and titanium silicide (TiSi), wherein at least one element component of Group II elements is ion-implanted into said contact region via said first metal layer to increase a carrier concentration of said contact region to decrease a contact resistance to said first metal layer.

9. A light emitting semiconductor device as set forth in claim 8, wherein said element component of Group II elements is selected from the group consisting of beryllium (Be), magnesium (Mg), zinc (Zn), calcium (Ca), strontium (Sr), cadmium (Cd) and mercury (Hg).

10. A light emitting semiconductor device comprising:

a stacked structure having a plurality of compound semiconductor layers, which include at least an n-type $In_xAl_yGa_{1-x-y}N$ ($0 \leq x \leq 1$, $0 \leq y \leq 1$, $x+y \leq 1$) layer having a contact region; and a first metal layer deposited on said contact region of said n-type $In_xAl_yGa_{1-x-y}N$ layer of said stacked structure, said first metal layer containing at least one element component selected from the group consisting of carbon (C), silicon (Si), germanium (Ge), tin (Sn), lead (Pb), oxygen (O), sulfur (S), selenium (Se), tellurium (Te) and polonium (Po), wherein said element component contained in said first metal layer is diffused to penetrate into said contact region of said n-type $In_xAl_yGa_{1-x-y}N$ layer to increase a carrier concentration of said contact region to decrease a contact resistance to said first metal layer.

11. The light emitting semiconductor device as set forth in claim 10, wherein said first metal layer contains at least one element component selected from the group consisting of carbon (C), silicon (Si), oxygen (O), sulfur (S) and selenium (Se).

12. A light emitting semiconductor device comprising:

a stacked structure having a plurality of compound semiconductor layers, which include at least an n-type $In_xAl_yGa_{1-x-y}N$ ($0 \leq x \leq 1$, $0 \leq y \leq 1$, $x+y \leq 1$) layer having a contact region; and a first metal layer deposited on said contact region of said stacked structure, said first metal layer being formed of at least one selected from the group consisting of carbon (C), germanium (Ge), selenium (Se), rhodium (Rh), tellurium (Te), iridium (Ir), zirconium (Zr), hafnium (Hf), copper (Cu), titanium nitride (TiN), tungsten nitride (WN), molybdenum (Mo) and titanium silicide (TiSi), wherein at least one element component of Group IV and VI elements is ionimplanted into said contact region via said first metal layer to increase a carrier concentration of said contact region to decrease a contact resistance to said first metal layer.

13. The light emitting semiconductor device as set forth in claim 12, wherein said element component of Group IV and VI elements is selected from the group consisting of carbon (C), silicon (Si), tin (Sn), sulfur (S), selenium (Se) and tellurium (Te).

14. A light emitting semiconductor device comprising:

a stacked structure having a plurality of compound semiconductor layers, which include at least a p-type $In_xAl_yGa_{1-x-y}N$ ($0 \leq x \leq 1$, $0 \leq y \leq 1$, $x+y \leq 1$) layer having a contact region; and a first metal layer deposited on said contact region of said stacked structure, said first metal layer being formed of at least one selected from the group consisting of carbon (C), germanium (Ge), selenium (Se), rhodium (Rh), tellurium (Te), iridium (Ir), zirconium (Zr), hafnium (Hf), copper (Cu), titanium nitride (TiN), tungsten nitride (WN), molybdenum (Mo) and titanium silicide (TiSi), wherein at least one element component of Group II elements is ion-implanted into said contact region via said first metal layer to increase a carrier concentration of said contact region to decrease a contact resistance to said first metal layer.

15. The light emitting semiconductor device as set forth in claim 14, wherein said element component of Group II elements is selected from the group consisting of beryllium (Be), magnesium (Mg), zinc (Zn), calcium (Ca), strontium (Sr), cadmium (Cd), and mercury (Hg).

* * * * *